United States Patent [19]

Grier, Sr.

[11] 4,072,771
[45] Feb. 7, 1978

[54] COPPER THICK FILM CONDUCTOR

[75] Inventor: John D. Grier, Sr., Harleysville, Pa.

[73] Assignee: Bala Electronics Corporation, Conshohocken, Pa.

[21] Appl. No.: 636,074

[22] Filed: Nov. 28, 1975

[51] Int. Cl.² .................. B05D 5/12; B32B 17/06; H01B 1/08
[52] U.S. Cl. .................. 427/96; 106/1.26; 29/625; 174/68.5; 252/512; 252/518; 427/58; 427/101; 427/126; 427/376 A; 427/376 B; 428/209; 428/403; 428/404; 428/432; 428/433; 428/469; 428/901
[58] Field of Search .................. 252/518, 512, 518.1, 252/518.2; 428/433, 404, 403, 409, 469, 901, 209, 432; 106/1; 427/96, 376 A, 376 B, 58, 101, 126; 29/625; 174/68.5

[56] References Cited

U.S. PATENT DOCUMENTS

| 2,294,756 | 9/1942 | Imutsuka | 252/518 |
|---|---|---|---|
| 2,924,540 | 2/1960 | D'Andrea | 428/210 |
| 2,993,815 | 7/1961 | Treptow | 428/209 |
| 3,018,198 | 1/1962 | Olson | 252/518 |
| 3,374,110 | 3/1968 | Miller | 252/514 |
| 3,479,217 | 11/1969 | Spanoudis | 428/433 |
| 3,647,532 | 3/1972 | Friedman | 252/512 |
| 3,776,769 | 12/1973 | Buck | 252/518 |
| 3,854,957 | 12/1974 | Larry | 428/469 |
| 3,928,242 | 12/1975 | May | 252/518 |

FOREIGN PATENT DOCUMENTS

| 731,728 | 4/1966 | Canada | 252/512 |
|---|---|---|---|
| 2,070,964 | 9/1971 | France | 252/512 |

Primary Examiner—Ellis Robinson
Attorney, Agent, or Firm—Smith, Harding, Earley & Follmer

[57] ABSTRACT

A method of making a copper thick film conductor paste which includes the step of preoxidizing a controlled amount of the copper powder particles. A copper thick film conductor paste, and an electrical conductor element and a method of making it from the paste.

14 Claims, 2 Drawing Figures

COPPER THICK FILM CONDUCTOR

BACKGROUND OF THE INVENTION

This invention relates to a copper thick film conductor paste and electrical conductor elements made therefrom, and also relates to a method of making the paste and to a method of making an electrical conductor element from the paste.

In the manufacture of electrical circuits, it has long been desired to provide a screen-printable copper conductor which could be used instead of more expensive conventional materials such as gold.

It has been desired to provide a screen-printable copper conductor that fires at conventional furnace temperatures, costs less than precious-metal conductors, and adheres strongly to substrates made of a variety of different materials which may be classified under four group types: single crystalline materials such as saphires, diamonds, niobates, tantalates, titanates, rutiles; poly crystalline materials such as ceramics which include for example, porcelains, steatites, aluminas, fosterites, ferrites; the amorphous materials such as silicate glasses; and materials known as "cermets", such as chromium - chromium oxide, which are a combination of ceramic and metal.

One of the problems with prior art copper thick film conductors is that they are not compatible with resistors.

It is known in the prior art to provide a conductive layer of copper on a substrate by spraying, dipping or screening a suspension of copper or copper oxide and powdered glass particles in a volatile organic suspension medium, drying said deposited film, and firing the film and substrate to remove any organic residual materials, to soften the glass powder and cause the glass portion of the suspension to establish a bond between the conductive metal film and the substrate, and to sinter the metal particles.

The prior art teaches that in the case where copper oxide is used, a layer of copper oxide is first established and a subsequent reduction firing is required to convert the oxide to free copper, which is a conductor. See U.S. Pat. No. 2,993,815, issued July 25, 1961 to Treptow which describes a copper process, and further describes a glass composition which resists chemical change under reducing environments in the firing oven.

Prior copper thick film conductor compositions have not performed well. For example, typically they withstand only 2–3 pounds peel on 80 mil square test pad, and have low conductivity of about 10 milliohms/square/mil sheet resistivity.

SUMMARY OF THE INVENTION

The present invention provides an improved copper thick film conductor paste which may be totally processed under a nitrogen cover or other inert, non-oxidizing and non-reducing environment such as argon or helium, and does not require, as does the prior art, oxidation or reduction processing steps.

The present invention is comptabile with a resistor paste at the interface between conductor and resistor.

The present invention provides a copper thick film conductor paste which includes copper powder in fine particle size, lead-aluminum-borosilicate glasses, and a vehicle. The finely divided copper particles provide better sintering characteristics.

The inventive method includes the step of preoxidizing the copper particles to form a desired percentage of copper oxide particles (cuprous oxide and/or cupric oxide). The copper oxide improves the adhesion of the metal film onto the substrate, and it makes the manufacture of electrical conductor elements less sensitive to variations in process conditions such as changes in temperature, and time or speed of the belt transporting the elements through an oven where the copper is fired onto the substrate.

In the firing step of manufacturing electrical conductor elements, a portion of the copper oxide is reduced to copper. However, some of the copper oxide is never reduced to copper, and this copper oxide combines with the glass to form an excellent bond with a ceramic or alumina substrate. Ceramics known to exhibit this chemical bonding property are beryllia, fosterite, steatite, and various titanate based ceramics, particularly those used to manufacture electrical capacitors. The copper oxide reacts with the alumina substrate and binds well to it. The copper aluminate formed by the reaction between the copper oxide and alumina is extremely stable and provides almost all the adhesion between the metal and the substrate when processed above about 850° C.

By comparison, a similar paste containing only copper particles and containing no copper oxide provides only 30% of the adhesion strength that is obtained with a paste containing the desired range of copper oxide.

One of the advantages of my inventive copper thick film paste is that it replaces gold and precious-metal pastes at considerably less cost, and yet provides a superior product.

The preferred particles of copper utilized in the present invention are small and granular. It is preferred not to use copper particles which are flaky because they cause pin holes and do not sinter well. Spherical particles are not desirable because they are contaminated with the milling acid used in making them.

My inventive use of preoxidized copper makes unnecessary the feeding of oxygen into a nitrogen furnace, which is throught to be necessary by some. Moreover, in feeding oxygen into a nitrogen oven, it is very difficult to control the parameters of the oven.

In general, prior art commercial copper film pastes were unsatisfactory because the vehicles did not burn out during the firing step, the glass frit was not compatible with the copper, and the copper itself was too big in particle size.

An electrical conductor element made in accordance with my invention has stronger adhesion to the substrate, superior solderability, and increased electrical conductivity. Also, the electrical conductor element is relatively insensitive to variations in process parameters.

It is important to note that the copper oxide of my invention is on the surface of the host metal, the copper powder which is to be bonded to the substrate.

DESCRIPTION OF THE PREFERRED EMBODIMENTS

Figure 1:
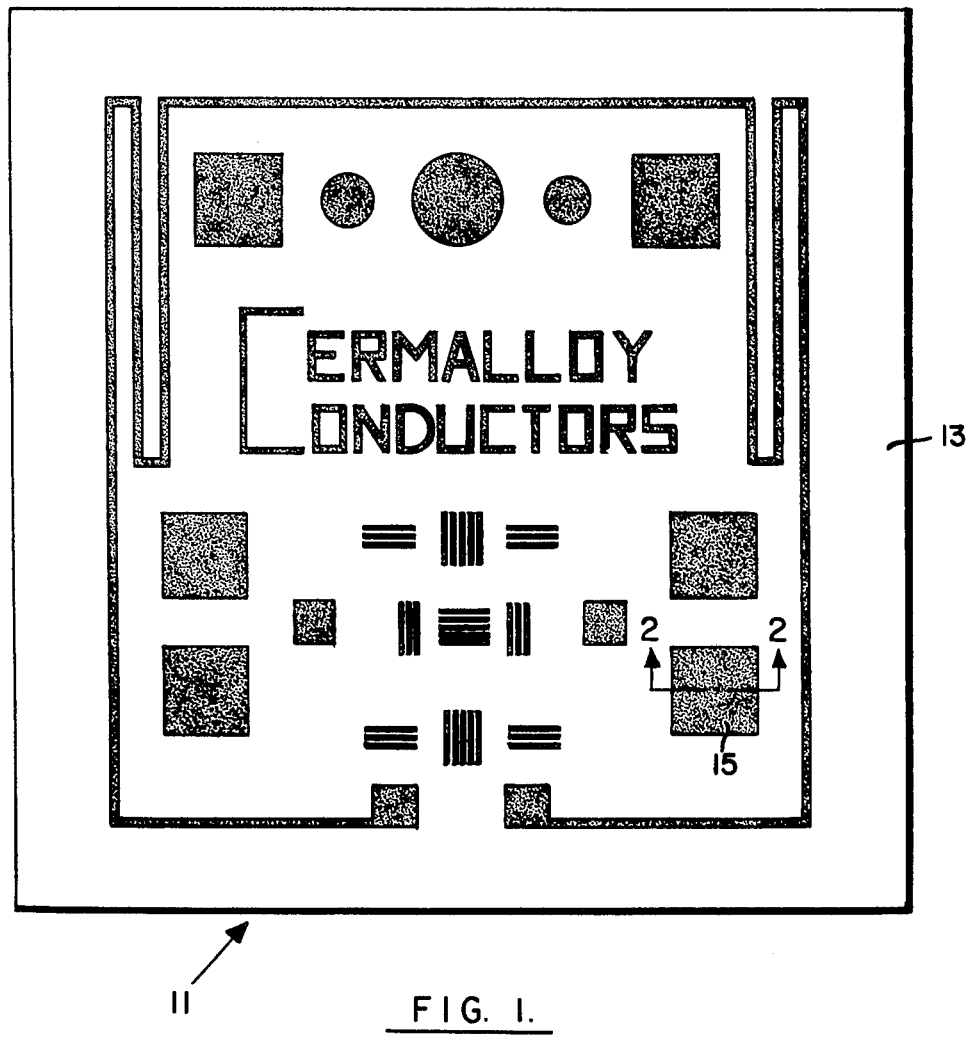
FIG. 1 is a view in top plan of an electrical conductor element constructed in accordance with the invention.
Figure 2:
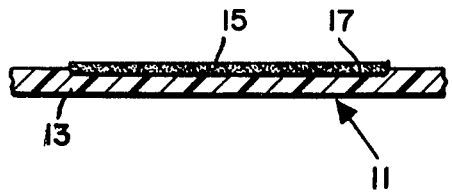
FIG. 2 is a view in section taken as indicated by the lines and arrows 2—2 which appear in FIG. 1.

In accordance with the present invention, there is provided a copper thick film paste and a method of making it, a method of bonding the copper to an alumina or ceramic substrate, and the resulting electrical conductor element.

The method of making the copper thick film conductor paste comprises the steps of making a powder of fine copper particles, preoxidizing the copper particles to form an oxidized copper powder of cuprous oxide and/or cupric oxide, mixing the oxidized copper powder and a glass frit which is about 2-5% by weight of the total solids in the copper-glass mixture, the copper oxide being about 1-5% by weight of the total solids in the solids mixture, and mixing the copper-glass mixture with about 15-25% by weight of a volatile decomposable suspending vehicle.

The suspending vehicle may be one of a member of the organic polymers comprised of an alkyl polymer having from one to six carbon atoms such as poly-n-butyl methacrylate (du Pont resin 2044), polymethylmethacrylate, and ethylmethocrylate, mixed with appropriate drying solvents such as pine oil, butyl carbitol acetate (Kodak Ectosolve), or toluene.

The glass frit may be lead borosilicate, or any of the glass frits disclosed in D'Andrea U.S. Pat. No. 2,924,540, Miller U.S. Pat. No.3,374,110 and Treptow U.S. Pat. No. 2,993,815, which are incorporated herein by reference. The preferred lead borosilicate frit has a composition by weight comprising lead oxide from 55-85%, silica from 3-50% and boric oxide from 3-50%.

The copper powder preferrably has particle sizes of about 1 to 10 microns.

The copper thick film conductor paste made by this method comprises a solids mixture, by weight of solids in the mixture, in the preferred ranges of about 92-97% free copper powder, about 1-5% of copper oxide and about 1-10% glass frit. A paste mixture is obtained by mixing the solids mixture with a volatile decomposable fluid suspension vehicle which is about 15-25% by weight of the paste mixture.

The method of making an electrical conductor element comprises the steps of making a powder of fine copper particles, preoxidizing the copper to form a controlled amount of surface oxidized copper powder, mixing the oxidized copper powder with glass frit comprising about 1-10% by weight of the solids in the mixture to form an oxidized copper-glass mixture, with the copper oxide being about 1-5% by weight of the total solids in the solids mixture, mixing the oxidized copper-glass mixture with a volatile and decomposable fluid suspending vehicle to form a copper thick film paste, applying the paste onto a substrate, drying the paste onto the substrate to volatilize the vehicle, and firing the remaining ingredients of the paste onto said substrate.

The fired-out product formed by this method is an electrical conductor element 11 which comprises a substrate 13, sintered free copper metalization 15, and a fine thin glass film 17 between the copper 15 and the substrate 13. The adhesion of the copper to the substrate is about 15-22 pounds as determined by the standard peel test, hereinafter described. The solderability of the copper is satisfactory, the resistance to solder wetting being about 3-6 seconds, as compared to the solderability of prior art elements of 8-12 seconds or more.

In the standard peel test, a square 80 or 100 mils on a side is printed onto a substrate, a wire is soldered into the square parallel to the substrate, the wire is bent to form an "L", and it is pulled by a calibrated spring mechanism to peel the square pad off the substrate and to record the number of pounds required to perform such peeling.

Solderability is determined by coating an electrical conductor element with solder flux, dipping the element entirely in molten solder to 60-40 lead/tin composition at about 230° C for 3 to 6 seconds to completely wet the copper conductor with the solder, withdrawing the element, and inspecting the quality of the wetting. If the wetting from the 3 to 6 second dip is satisfactory, the solderability is considered good. If the wetting is not satisfactory until the dipping is 8 to 12 seconds, the solderability is considered poor.

Conventional copper thick film formulas vary greatly as to the copper powder content relative to the glass frit content and relative to the vehicle content. Also an undertermined amount of copper oxide may be present in the mixture, incorporated therein accidentally as by over-drying the paste after it is applied to the ceramic substrate. Conventionally, the drying step is performed for the sole purpose of volatilizing the vehicle.

In the inventive paste formulation, a 1 to 10% glass frit content by weight of the solids content provides superior adhesion in the range of 8 to 22 pounds, if the copper oxide content is about 3%, as determined by the standard peel test, whereas a zero glass content provides a product which has extremely low film adhesion to the substrate.

On the other hand, over 10% of glass frit by weight of the total solids content generally results in loss of adhesion, presumably due to the complete disolving of the copper oxide by the frit component.

The degree of oxidation of the copper powder has been varied in the inventive formulation in order to determine the effect of such variation. Below 1% surface oxidation of the copper powder, by weight of the total copper, the conductor shows poor film adhesion. From 1% to 3% surface oxidation of the copper, by weight of total copper, the conductor shows an increase in adhesion which levels off to about 5% oxidized copper, and then drops off.

The addition of controlled amounts of copper oxide is a distinct advantage over known existing copper paste products because the resultant films are high performing and are more reproducable since they are more insensitive to variations in processing conditions.

Without intentional and controlled oxidation of the copper powder, the solderability, adhesion, and conductivity characteristics of the resulting paste are a function of accidental processing conditions.

Below about 1% copper oxide content by weight of total copper, the film adhesion is typically about 3-4 pounds as determined by the standard peel test and this is considered poor.

Also, a typical variation in adhesion of conventional copper pastes is from about 5-10 pounds, as determined by the standard peel test, depending upon how much copper oxide has been formed accidentally by the drying step of the paste, or during the fabrication of the copper powder itself.

If conventional copper film pastes were overdried, the resulting electrical conductor elements gave good results for unknown reasons. It is now surmised that these good results were caused by the unknown and unrealized oxidation of the copper powder during the drying step, the step that volitalized the vehicle.

It is to be noted that overdrying or over-firing do not affect the inventive process because the preoxidation of the copper powder has already raised the copper oxide content of the formulation to the range that insures good results.

The amount of vehicle present, preferrably in the range of about 15–25% by weight of the total composition, determines the amount of solids delivered to a standard screen print on a substrate. If the vehicle content is high, the amount of solids delivered is low, and the paste is less viscous and runny. If the vehicle content is low, the amount of solids delivered to the substrate is high, and the paste is more viscous and stiffer for clearer definition in printing fine circuit elements.

Film thicknesses of less than 0.005 inch show poor adhesion, and thicknesses greater than 0.015 inch show sintering shrinkage distortion, i.e., the thinner films adhere poorly to the substrate, while the thicker films sinter poorly and have cohesion problems, rather than adhesion problems, because the excess metal sinters to itself and pulls away from the substrate.

The following examples illustrate the invention:

EXAMPLE 1

|  | Wt. Percent |
| --- | --- |
| Cu | 95% of total solids |
| Copper Oxide | 3% of total solids |
| Glass Frit | 2% of total solids |
| Vehicle | 18% of total mix |

A powder of fine copper particles about 1 to 10 microns in size is made by grinding. The copper particles are preoxidized by placing them in an air drying oven at 110° C for 26 hours at atmospheric pressure to form oxidized copper powder, which may be cuprous oxide and/or cupric oxide. The oxidized copper powder is mixed with a glass frit, lead borosilicate having a lead oxide content of about 65%, comprising about 2% by weight of the total solids in the solids mixture, with the oxidized copper being about 3% by weight of the total solids in the solids mixture. The solids mixture is mixed with a volatile and decomposable fluid suspending vehicle comprising 30% poly-n-butyl methacrylate (du Pont 2044 resin), in 60% butyl carbitol acetate (Kodak Ectosolve), the suspending vehicle being about 18% by weight of the total mixture.

Portions of the resulting copper thick film paste are applied to alumina substrates by silk screening. The paste is dried on the substrates, evaporating the vehicle, by subjecting the paste and substrates to a temperature of about 150° C for a period of about seven minutes in air, to form unfired conductor elements. Then the elements are fired in an oven at a temperature of about 875° C for about 6 minutes in a nitrogen atmosphere to sinter the copper and adhere it to the substrate and form electrical conductor elements.

The electrical conductor elements comprise a substrate, a sintered free copper metalization, and a fine thin glass film between the copper and the substrate.

Thirty test squares are made by silk screening squares of paste onto substrates, drying, and firing in accordance with my method of making conductor elements, and are adhesion tested by subjecting them to the standard peel test. The results typically vary between 16 and 22 pounds peel.

The solderability of the mixture is tested prior to the peel test by dipping the thirty test squares in 60/40 lead/tin solder at 230° C for about 4 second and observing that the wetting of the conductor by the solder was satisfactory.

EXAMPLE 2

|  | Wt. Percent |
| --- | --- |
| Cu | 92% of total solids |
| Copper Oxide | 3% of total solids |
| Glass Frit | 5% of total solids |
| Vehicle | 18% of total mix |

The ingredients in Example 2 are the same as in Example 1, but the amounts are changed. The same method steps are followed in all Examples unless otherwise stated. The resulting adhesion tests give test results which typically vary between 18 and 20 pounds peel, and solderability is satisfactory in about four seconds dip.

EXAMPLE 3

|  | Wt. Percent |
| --- | --- |
| Cu | 97% of total solids |
| Copper Oxide | 1% of total solids |
| Glass Frit | 2% of total solids |
| Vehicle | 18% of total mix |

The ingredients in Example 3 are the same as in Examples 1 and 2, but the amounts are changed. The tests show an adhesion of between 5 and 8 pounds peel. Solderability is satisfactory.

EXAMPLE 4

|  | Wt. Percent |
| --- | --- |
| Cu | 94% of total solids |
| Copper Oxide | 1% of total solids |
| Glass Frit | 5% of total solids |
| Vehicle | 18% of total mix |

The ingredients of Example 4 are the same as in Example 1, except that the percentage of the individual solids is changed. The tests show adhesion of 5 to 8 pounds peel. Solderability is satisfactory.

EXAMPLE 5

|  | Wt. Percent |
| --- | --- |
| Cu | 97.5% of total solids |
| Copper Oxide | .5% of total solids |
| Glass Frit | 2% of total solids |
| Vehicle | 18% of total mix |

The ingredients of Example 5 are the same as in Example 1, and the method steps are the same. The percentage of ingredients differ from the percentages in Example 1, and the tests show adhesion of 2 to 3 pounds peel, with satisfactory solderability.

EXAMPLE 6

|  | Wt. Percent |
| --- | --- |
| Cu | 94.5% of total solids |
| Copper Oxide | .5% of total solids |
| Glass Frit | 5% of total solids |

Example 6-continued

| | |
|---|---|
| Vehicle | 18% of total mix |

Example 6 contains the same ingredients as Example 1 but differs in the percentages of ingredient. The test results show adhesion of about 2 to 3 pounds peel. The copper sinters well during the firing steps, but the adhesion at the interface between the copper and the substrate is lower than that in Example 1 and 2.

EXAMPLE 7

| | Wt. Percent |
|---|---|
| Cu | 93% of total solids |
| Copper Oxide | 5% of total solids |
| Glass Frit | 2% of total solids |
| Vehicle | 18% of total mix |

The ingredients in Example 7 are the same as in Example 1, except that the copper oxide has been increased to 5%, and the copper reduced to 93%, with the frit remaining 2%. The tests show adhesion of 4 to 6 pounds peel. The copper does not sinter as well as in Examples 1 and 2.

EXAMPLE 8

| | Wt. Percent |
|---|---|
| Cu | 90% of total solids |
| Copper Oxide | 5% of total solids |
| Glass Frit | 5% of total solids |
| Vehicle | 18% of total mix |

The ingredients in Example 8 are the same as Example 1, and the copper oxide is 5% of total solids. However, the free copper is reduced to 90% and the frit is increased to 5%. The adhesion tests show 4 to 6 pounds peel, and the copper does not sinter as well as in Examples 1 and 2.

The prior art Treptow U.S. Pat. No. 2,993,815 uses two basic approaches. His first approach uses copper powder, and the second uses copper oxide with the intention of processing it in a reducing atmosphere such as hydrogen. In my invention, the approach is to preoxidize pure fine copper powder particles at the particle surface to a preferred level of about 3% by weight of the solids mix.

My method provides a much superior product than other known copper pastes. Improvement over other similar materials is seen particularly in adhesion and in soliderability. Also, of particular advantage is the relative insensitivity of the preoxidized material to variations in processing conditions. This insensitivity is seen in reduced variations in the performance characteristics of the fired-out conductor.

In my inventive method, the copper particles are preoxidized so as to establish a controlled quantity of copper oxide on each copper particle surface. This powder is mixed with a small quantity of glass powder, such a small amount that the glass is not considered to be a binder in the conventional sense. This powder mixture is then mixed into an organic vehicle to form a screen-printable paste, printed to form a conductor pattern, and dried. Then it is fired in a nitrogen atmosphere, an inert, non-oxidizing and non-reducing atmosphere, to directly provide a free copper conductor pattern since the oxide is dissolved by the glass during the firing step.

An advantage of my invention over the Treptow copper glass system is that my glass is used to dissolve the copper oxide away from the surface of the copper particles which promotes sintering. Further, the glass carries the dissolved oxide to the surface of the alumina substrate where it reacts to provide the primary adhesion, assisted by the secondary adhesion between the glass and the alumina which was the only type of adhesion provided by the prior art.

I claim:

1. A method of making a copper thick film conductor paste consisting essentially of
    taking a powder of fine copper particles,
    preoxidizing the surface of the fine copper particles to form an oxidized copper powder having a surface copper oxide,
    mixing the oxidized copper powder with a glass frit comprising about 1–10% by weight of the total solids in the solids mixture,
    said copper oxide being about 1 to about 5% by weight of the total solids in the solids mixture,
    and mixing the solids mixture with a volatile and decomposable fluid suspending vehicle to make a copper thick film conductor paste.

2. The method of claim 1,
    said suspending vehicle being about 15–25% by weight of the total mixture.

3. The method of claim 1,
    said glass frit being in the range of about 2% to about 5% by weight of the total solids content.

4. The method of claim 1,
    said glass frit being lead borosilicate frit having a lead oxide content of between about 55 to 85%.

5. The method of claim 1,
    said oxidized copper powder being granular and having particle sizes in the range of about 1 to about 10 microns.

6. The method of claim 1,
    said copper being about 95% by weight of the total solids in the solids mixture,
    said copper oxide being about 3% by weight of the total solids in the solids mixture,
    said glass frit being about 2% by weight of the total solids in the solids mixture,
    said glass frit being about 2% by weight of the total solids in the solids mixture and being a lead borosilicate frit having a lead oxide content of between about 55 to about 85%,
    said suspending vehicle being about 18% by weight of the total mixture,
    said suspending vehicle being 30% poly-n-butyl methacrylate in 60% butyl carbitol acetate,
    and said oxidized copper powder having particle sizes in the range of about 1 to about 10 microns.

7. A copper thick film conductor paste adapted to be applied to and fired onto an insulating substrate to form an electrical conductor element, consisting essentially of
    a mixture of about 92–97% of free copper powder by weight of solids in the mixture,
    about 1–5% of copper oxide by weight of solids in the mixture,
    about 1–10% of glass frit by weight of solids in the mixture,
    and a volatile and decomposable fluid suspending vehicle.

8. The copper thick film conductor paste of claim 7, said suspending vehicle being about 15–25% by weight of the total mixture.

9. The copper thick film conductor paste of claim 7, the glass frit being in the range of about 2% to about 10% by weight of the total solids content.

10. The copper thick film conductor paste of claim 7, said glass frit being a lead borosilicate frit having a lead oxide content of between about 55 to 85%.

11. The copper thick film conductor paste of claim 7, said oxidized copper powder being granular and having particle sizes in the range of about 1 to about 10 microns.

12. The copper thick film conductor paste of claim 7,
said copper being about 95% by weight of the total solids in the solids mixture,
said copper oxide being about 3% by weight of the total solids in the solids mixture,
said glass frit being about 2% by weight of the total solids in the solids mixture and being a lead borosilicate frit having a lead oxide content of between 55% to about 85%,
said suspending vehicle being about 18% by weight of the total mixture,
said suspending vehicle being 30% poly-n-butyl methacrylate in 60% butyl carbitol acetate,
and said oxidized copper powder having particle sizes in the range of about 1 to about 10 microns.

13. A method of making an electrical conductor element consisting essentially of the steps of
taking a powder of fine copper particles,
preoxidizing the copper to form an oxidized copper powder,
mixing the oxidized copper powder with a glass frit comprising about 1–10% by weight of the total solids in the solids mixture,
with the copper oxide being about 1–5% by weight of the total solids in the solids mixture,
mixing the solids mixture with a volatile and decomposable fluid suspending vehicle to form a copper thick film paste,
applying the paste onto an insulating substrate,
drying the paste on the substrate and evaporating the vehicle,
and firing said substrate in an inert, non-oxidizing, non-reducing atmosphere to adehere said copper thereto.

14. The method of claim 13 in accordance with Example 1, including
grinding the copper to a powder of fine copper particles about 1 to 10 microns in size,
preoxidizing the copper particles by placing them in an air drying oven at 110° C for 26 hours at atmospheric pressure to form an oxidized copper powder,
drying the paste on the substrate and evaporating the vehicle by subjecting the paste and substrate to a temperature of 150° C for a period of seven minutes in air to form unfired conductor elements,
and then firing the conductor elements in an oven at a temperature of about 870° C for about 6 minutes in a nitrogen atmosphere to sinter the copper and adhere it to the substrate and form an electrical conductor element.

* * * * *